(12) United States Patent
Suzuki et al.

(10) Patent No.: US 10,651,118 B2
(45) Date of Patent: May 12, 2020

(54) ELECTRONIC DEVICE

(71) Applicant: DENSO CORPORATION, Kariya, Aichi-pref. (JP)

(72) Inventors: Kosuke Suzuki, Kariya (JP); Atsushi Kashiwazaki, Kariya (JP); Yuki Sanada, Kariya (JP); Toshihiro Nakamura, Kariya (JP); Shinya Uchibori, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/385,285

(22) Filed: Apr. 16, 2019

(65) Prior Publication Data
US 2019/0244886 A1    Aug. 8, 2019

Related U.S. Application Data

(63) Continuation of application No. PCT/JP2017/037894, filed on Oct. 19, 2017.

(30) Foreign Application Priority Data

Nov. 1, 2016 (JP) .................................. 2016-214541

(51) Int. Cl.
| | |
|---|---|
| H05K 1/11 | (2006.01) |
| H05K 1/18 | (2006.01) |
| H01L 23/498 | (2006.01) |
| H05K 3/28 | (2006.01) |
| H01L 23/28 | (2006.01) |
| H01L 23/31 | (2006.01) |

(52) U.S. Cl.
CPC ........ *H01L 23/49838* (2013.01); *H01L 23/28* (2013.01); *H01L 23/49827* (2013.01); *H05K 1/111* (2013.01); *H05K 1/114* (2013.01); *H05K 1/181* (2013.01); *H05K 3/28* (2013.01); *H01L 23/31* (2013.01); *H05K 2201/099* (2013.01); *H05K 2201/0989* (2013.01); *H05K 2201/09236* (2013.01)

(58) Field of Classification Search
CPC ............... H01L 23/49838; H01L 23/28; H01L 23/49827; H01L 23/31; H05K 3/28; H05K 1/114; H05K 2201/0989; H05K 2201/099; H05K 2201/09236
See application file for complete search history.

(56) References Cited

U.S. PATENT DOCUMENTS

| | | | | |
|---|---|---|---|---|
| 6,175,152 B1 * | 1/2001 | Toyoda | ............. | H01L 23/49838 257/689 |
| 2002/0043704 A1 * | 4/2002 | Seko | ..................... | H01L 21/563 257/678 |
| 2002/0043713 A1 * | 4/2002 | Seko | ..................... | H01L 21/563 257/692 |

FOREIGN PATENT DOCUMENTS

| | | |
|---|---|---|
| JP | 2002-016339 A | 1/2002 |
| JP | 2011-071181 A | 4/2011 |

* cited by examiner

*Primary Examiner* — Ishwarbhai B Patel
(74) *Attorney, Agent, or Firm* — Posz Law Group, PLC

(57) ABSTRACT

A solder resist is configured such that pattern covering portions of the solder resist covering straight portions of adjacent wiring patterns are separated from each other in an area outside of a resin mold part. Thus, even if the solder resist is cracked, cracks will not be formed so as to connect between the adjacent wiring patterns. As such, even if moisture generated by condensation or the like enters in the crack, it is less likely that a short circuit will occur between the adjacent wiring patterns.

3 Claims, 5 Drawing Sheets

10,651,118 B2

ELECTRONIC DEVICE

CROSS REFERENCE TO RELATED APPLICATIONS

The present application is a continuation application of International Patent Application No. PCT/JP2017/037894 filed on Oct. 19, 2017, which designated the U.S. and claims the benefit of priority from Japanese Patent Application No. 2016-214541 filed on Nov. 1, 2016. The entire disclosures of all of the above applications are incorporated herein by reference.

TECHNICAL FIELD

The present disclosure relates to an electronic device in which wiring patterns formed on a substrate are covered with a solder resist, and the solder resist and the wiring patterns are partly covered with a molded resin.

BACKGROUND

An electronic device may have a configuration in which wiring patterns formed on a substrate, such as a printed wiring board, are covered with a solder resist, and the solder resist and the wiring patterns are partly covered with a molded resin. The solder resist may be formed so as to entirely cover the wiring pattern except for an electrically connecting portion of the wiring pattern to be connected to an outside, such as a through hole via. The solder resist may be further formed so as to connect between adjacent wiring patterns, also outside of the molded resin.

SUMMARY

The present disclosure describes an electronic device including a substrate, an electronic component, a solder resist, and a resin mold part. The substrate has one surface and the other surface opposite to the one surface, and includes a plurality of wiring patterns each having at least a straight portion. The solder resist covers the wiring patterns. The electronic component is electrically connected to a portion of at least one of the wiring patterns on the one surface of the substrate, the portion exposing from the solder resist. The resin mold part is disposed on the one surface of the substrate to cover the electronic component and to partly cover the wiring patterns and the solder resist.

DETAILED DESCRIPTION

Figure 1:
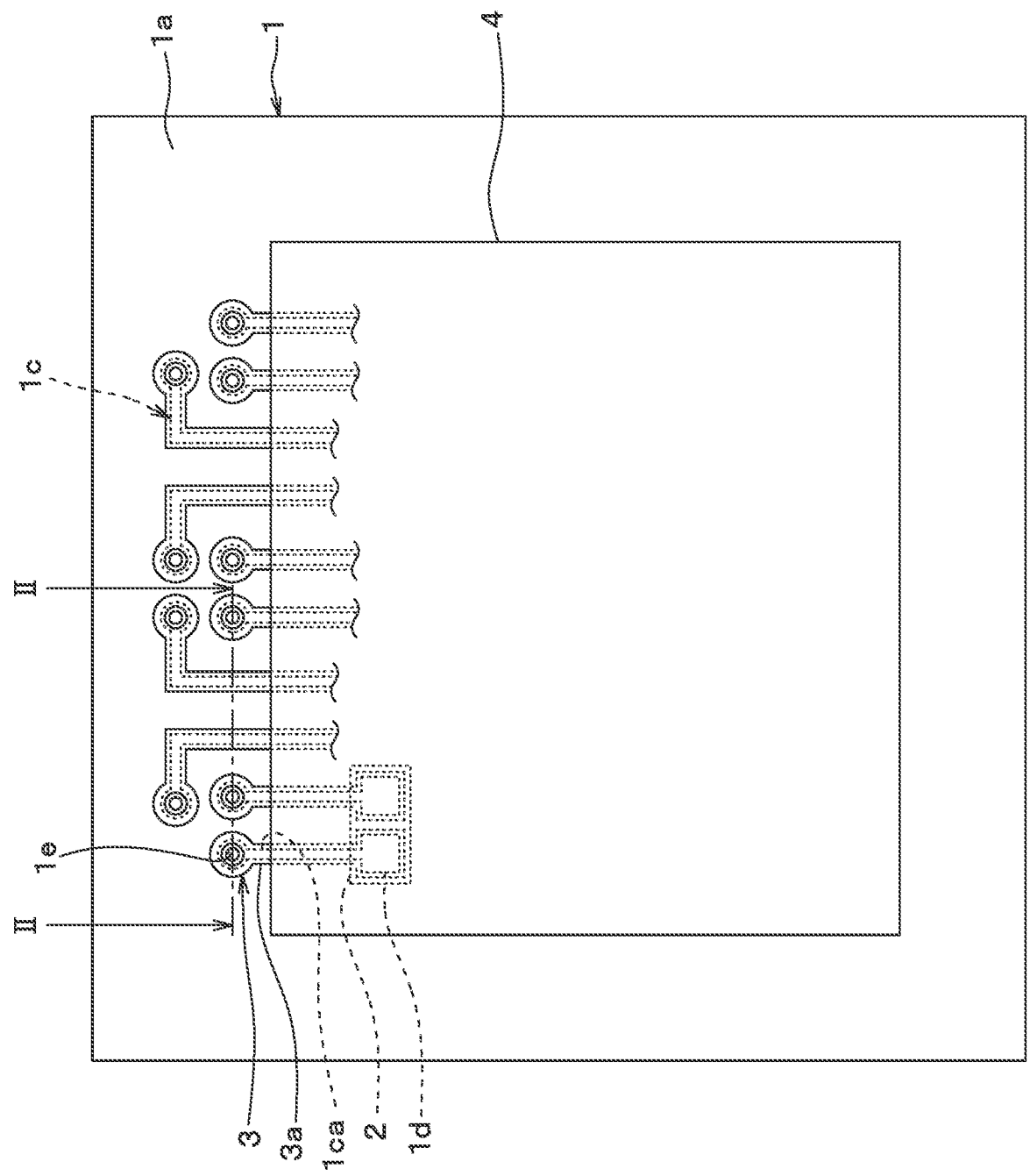
FIG. 1 is a diagram illustrating an upper surface layout of a semiconductor device according to a first embodiment.

An electronic device may have a configuration in which wiring patterns formed on a substrate, such as a printed wiring board, are covered with a solder resist, and the solder resist and the wiring patterns are partly covered with a molded resin. The solder resist may be formed so as to entirely cover the wiring pattern except for an electrically connecting portion of the wiring pattern to be connected to an outside, such as a through hole via. The solder resist may be further formed so as to connect between adjacent wiring patterns, also outside of the molded resin.

When such an electronic device is used under a severe environment, cracks may occur in the portion of the solder resist exposed from the molded resin due to the thermal stress. In such a case, there is a concern that moisture may enter into the crack when condensation occurs, and a short circuit may occur between the adjacent wiring patterns.

According to an aspect of the present disclosure, an electronic device includes: a substrate that has one surface and the other surface opposite to the one surface, and includes a plurality of wiring patterns each having at least a straight portion; a solder resist that covers the wiring patterns; an electronic component that is electrically connected to a portion of at least one of the wiring patterns on the one surface of the substrate, the portion exposing from the solder resist; and a resin mold part that is disposed on the one surface of the substrate to cover the electronic component and to partly cover the wiring patterns and the solder resist. In such a configuration, the wiring patterns are disposed such that the straight portions are extended to an area outside of the resin mold part. The solder resist includes pattern covering portions that cover the straight portions of at least adjacent two of the wiring patterns, and the pattern covering portions are separated from each other in the area outside of the resin mold part.

The pattern covering portions of the solder resist, which cover the straight portions of the adjacent wiring patterns, are separated from each other.

Therefore, even if the solder resist is cracked, a crack will not extend to connect between the adjacent wiring patterns. Accordingly, even if moisture caused by condensation or the like enters the crack, it is less likely that a short circuit will occur between the adjacent wiring patterns.

According to another aspect of the present disclosure, the wiring patterns are disposed such that the straight portions are extended to an area outside of the resin mold part. The solder resist includes pattern covering portions that cover the straight portions of the wiring patterns, and a connecting portion that connects between the covering portions. An end portion of the connecting portion is protruded to the area outside of the resin mold part. The pattern covering portions and the connecting portion are configured to satisfy a relationship of a>2×b, in which "a" is a distance between the straight portions adjacent to each other, and "b" is a protruded length of the connecting portion protruded from an end portion of the resin mold part.

Since the distance "a" and the protruded length "b" are defined so as to satisfy the relationship of a>2×b, it is possible to restrict cracks developed from intersecting with each other. Accordingly, it is less likely that a short circuit will occur between the adjacent wiring patterns, for example, when condensation or the like occurs.

Embodiments of the present disclosure will be described hereinafter with reference to the drawings. In the following descriptions of the respective embodiments, parts identical with or equivalent to each other are designated with the same reference numbers.

First Embodiment

An electronic device according to a first embodiment will be described with reference to FIGS. 1 to 3. For example, the electronic device is mounted on a vehicle such as a car, and is used as a device for driving each device of the vehicle. Therefore, when the electronic device is used, for example, for driving a mechanism that highly generates heat in an engine compartment, it is subjected to be in a severe use environment receiving a thermal stress.

Figure 2:
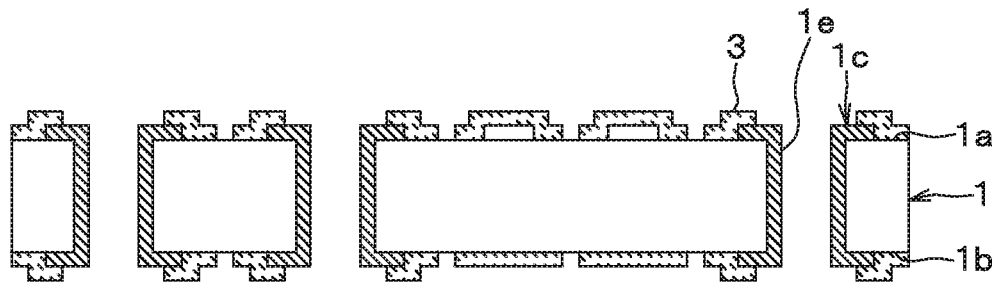
FIG. 2 is a diagram illustrating a cross-sectional view taken along a line II-II in FIG. 1.
Figure 3:
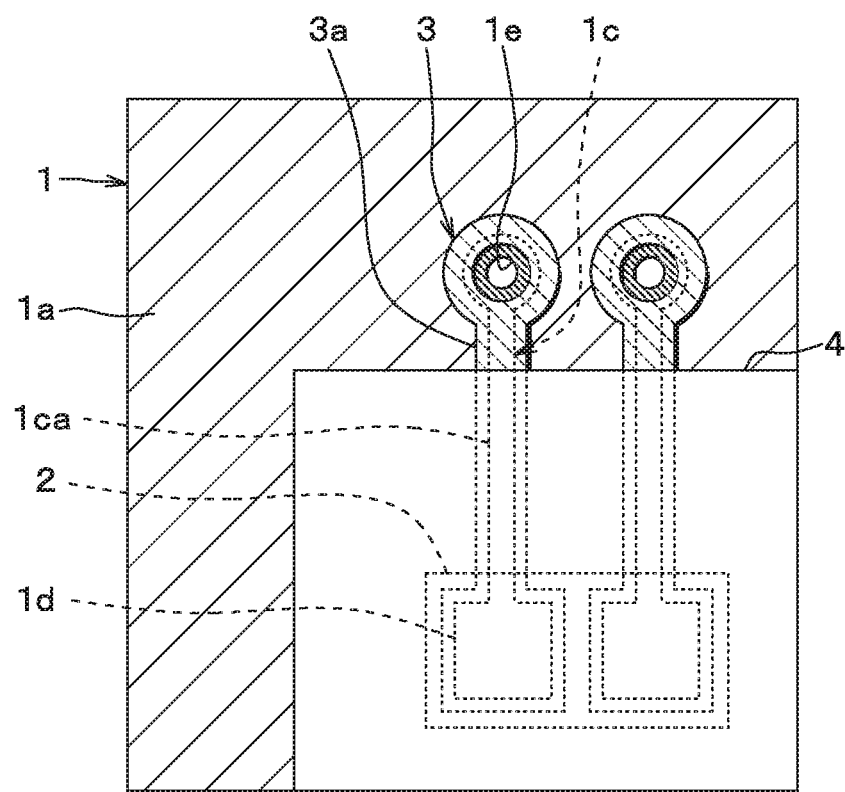
FIG. 3 is a diagram illustrating an enlarged view of a left corner portion in FIG. 1.

As shown in FIGS. 1 to 3, in the electronic device, a circuit board 1 configured by a printed wiring board or the like is used as a substrate. When the circuit board 1 is formed of a printed wiring board, the base material is formed of an epoxy resin or the like.

The circuit board 1 has one surface 1a and the other surface 1b opposite to the one surface 1a, as shown in FIG. 2. Desired wiring patterns 1c, which are provided by surface wirings or the like, are formed on the one surface 1a. The wiring patterns 1c are made of, for example, copper. The wiring patterns 1c are formed to have predetermined pattern shapes by etching or the like.

As shown in FIGS. 1 and 3, the wiring patterns 1c are provided by plural portions divided from each other. Each of the wiring patterns 1c has an end formed with a pad portion 1d, and the other end connected to a through hole via 1e. For example, an electronic component 2 is mounted on the pad portion 1d, as shown by a dashed line in FIG. 2. In this way, electrical connections between the electronic component 2 and the wiring patterns 1a are achieved. Examples of the electronic component 2 include a transistor, a capacitor, a resistor and the like, and terminals of the electronic component 2 are electrically connected to the pad portions 1d.

The through hole via 1e enables an electrical connection between the wiring pattern 1c and an external device, as a non-illustrated terminal, which for example has a pin shape, is inserted into the through hole via 1e. With such a configuration, the electronic component 2 is electrically connected to the external device from the pad portion 1d through the wiring pattern 1c and the through hole via 1e.

More specifically, each wiring pattern 1c is formed into a line shape. Although not illustrated, the wiring pattern 1c is extended to a desired position where the electronic component 2 or the like is mounted, inside of a resin mold part 4, which will be described later. The pad portion 1d is formed at the end extended to the desired position. In the vicinity of the outer edge of the resin mold part 4, the wiring patterns 1c are arranged in parallel and are extended to an area outside of the resin mold part 4. The distance between the adjacent wiring patterns 1c may not be constant. In the present embodiment, however, the case where the distance is constant is illustrated.

Further, on the one surface 1a of the circuit board 1, a solder resist 3 is formed to cover the wiring patterns 1c. For example, the solder resist 3 is made of an epoxy-based material. In the case of the present embodiment, the solder resist 3 is divided into a plurality of sections so as to separately cover each one of the wiring patterns 1c. Specifically, in the case of the present embodiment, the solder resist 3 is formed so as to cover the wiring patterns 1c and the periphery of the wiring patterns 1c. At a straight portion 1ca of the wiring pattern 1c, the width of the solder resist 3 is greater than the width of the straight portion 1ca so as to entirely cover the straight portion 1ca, and the solder resist 3 protrudes over from both sides of the straight portion 1cs by a predetermined width.

However, the amount of protrusion of the solder resist 3 protruding from both the sides of the straight portion 1ca is smaller than a half of distance between the adjacent straight portions 1ca. Thus, a predetermined gap remains between the adjacent solder resist 3a. That is, a portion of the solder resist 3 formed along the straight portion 1ca and covering the straight portion 1ca is referred to as a pattern covering portion 3a. Adjacent pattern covering portions 3a covering the adjacent straight portions 1ca are spaced from each other.

The solder resist 3 is not formed on at least the inner wall surface of the through hole via 1e, so that the inner wall surface of the through hole via 1e can be electrically connected to the connection terminal, which is not shown.

On the one surface 1a of the circuit board 1, the resin mold part 4 is formed so as to cover the electronic component 2 as well as to cover the wiring patterns 1c and the solder resist 3. In this example, the resin mold part 4 is formed by a resin molding technique, such as compression molding or transfer molding. However, the resin mold part 4 may be formed by potting or the like.

In the present embodiment, the resin mold part 4 has a rectangular shape as a top surface shape. The wiring patterns 1c and the solder resist 3 are partly exposed from the resin mold part 4 as the straight portions 1ca and the pattern covering portions 3a are extended to the area outside of the resin mold part 4 from one side of the rectangular top shape of the resin mold part 4. More specifically, the straight portion 1ca and the pattern covering portion 3a are drawn out perpendicularly to the one side of the resin mold part 4. In FIG. 3, resist pattern 3 and the exposed substrate surface 1a are illustrated with different shading. Comparative example FIG. 4 has analogous shading.

The electronic device of the present embodiment is configured as described hereinabove. The electronic device configured as described hereinabove is electrically connected to an external device as a plurality of connection terminals protruding from a bottom surface of a case are inserted into the through hole vias 1a to be in direct-contact with the through hole vias 1e or to be connected through a solder.

In a case where such an electronic device is used as a device for driving each device of a vehicle, such as used as a device for driving a mechanism that generates a large amount of heat in an engine compartment, the electronic device is placed in a severe environment applied with a thermal stress. In such a case, a crack may occur in the solder resist 3 due to the thermal stress.

Figure 4:
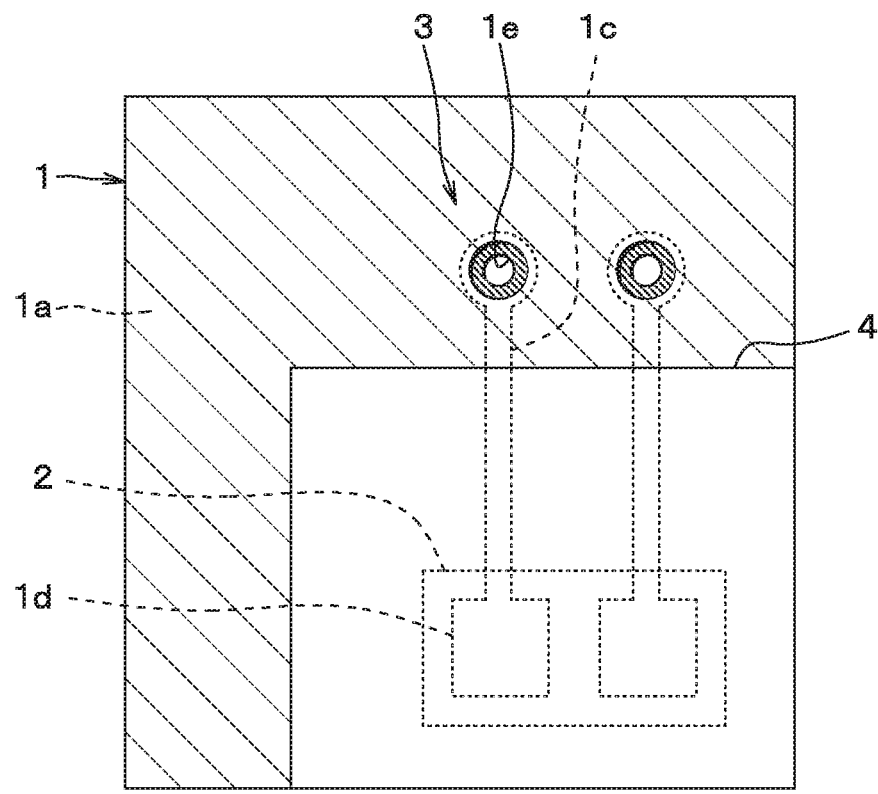
FIG. 4 is a diagram illustrating a partially enlarged upper surface layout of an electronic device having an entirely covering solder resist as a comparative example.

Thus, in a conventional configuration in which a region other than the through hole vias 1e is covered with the solder resist 3, as shown in FIG. 4, since the solder resist 3 is formed over the entire surface, a short-circuit may occur between adjacent wiring patterns 1c due to the crack.

In the present embodiment, on the other hand, the pattern covering portions 3a of the solder resist 3, which cover the straight portions 1ca of the adjacent wiring patterns 1c, are separated from each other in the area outside of the resin mold part 4. Therefore, even if a crack occurs in the solder resist 3, it is less likely that the crack will extend so as to connect the adjacent wiring patterns 1c. Accordingly, even if moisture due to condensation or the like enters the crack, it is possible to suppress a short-circuit between the adjacent wiring patterns 1c.

Second Embodiment

A second embodiment will be described. In the present embodiment, an upper surface layout of the solder resist 3 is modified from that of the first embodiment, and the other configurations are similar to those of the first embodiment. Hereinafter, only configurations different from the first embodiment will be described.

Figure 5:
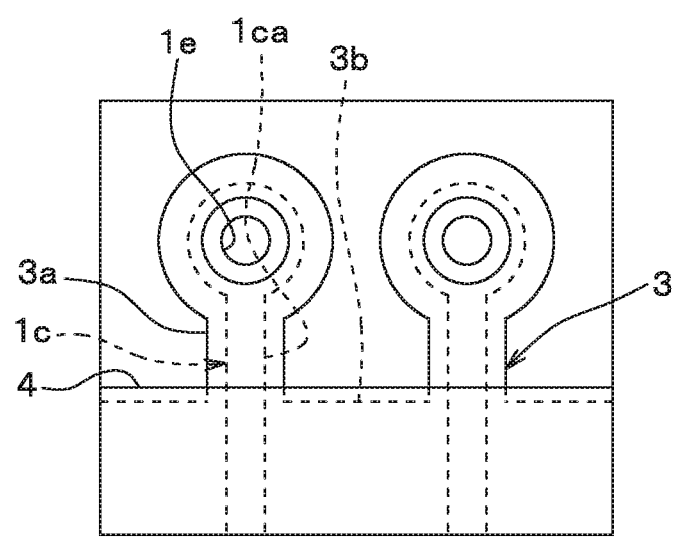
FIG. 5 is a diagram illustrating an enlarged upper surface layout of a part of an electronic device according to a second embodiment.

In the present embodiment, as shown in FIG. 5, the pattern covering portions 3a covering the adjacent straight portions 1ca are connected to each other. However, a connecting portion of the pattern covering portions 3a is covered with the resin mold part 4, while the pattern covering portions 3a in the area outside of the resin mold part 4 are separated from each other. That is, the entirety of an end portion of the connecting portion 3b, which connects the pattern covering portions 3a covering the adjacent straight portions 1ca, is located in an area covered with the resin mold part 4 than the end portion of the resin mold part 4.

Even if condensation occurs, the entry of moisture is restricted in an area covered with the resin mold part 4. For this reason, even if the solder resist 3 is cracked, moisture does not enter the crack when dew condensation occurs, so a short circuit between the adjacent wiring patterns 1c can be suppressed. Accordingly, the similar effects to the first embodiment can be achieved.

Modification of Second Embodiment

Figure 6:
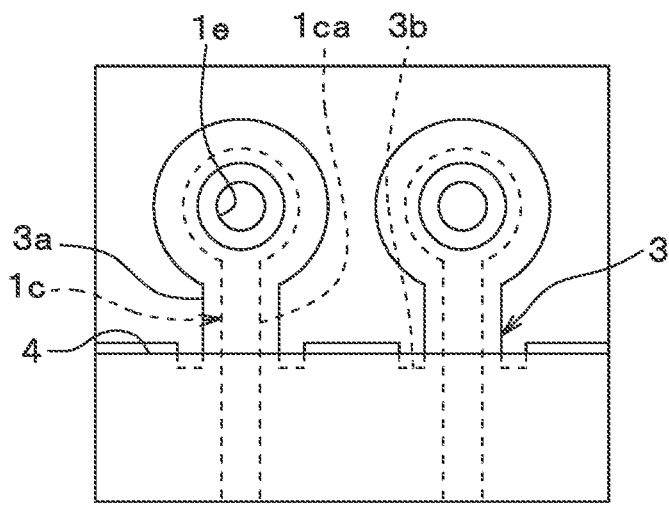
FIG. 6 is a diagram illustrating an enlarged upper surface layout of a part of an electronic device as a modification of the second embodiment.

In the second embodiment, in the case where the pattern covering portions 3a, which cover the adjacent wiring patterns 1c, are connected via the connecting portion 3b, a structure in which the pattern covering portions 3a are not connected in the area outside the resin mold part 4 is exemplified. Such a structure is not limited to a structure in which the entirety of the end portion of the connecting portion 3b is located in the area covered with the resin mold part 4. A structure in which at least a part of the end portion of the connecting portion 3b is located in the area covered with the resin mold part 4 may be applicable. For example, as shown in FIG. 6, the end portion of the connecting portion 3b can be partly located in the area covered with the resin mold part 4 at the boundary position between the connecting portion 3b and the pattern covering portion 3a.

Third Embodiment

A third embodiment will be described. In the present embodiment, an upper surface layout of the solder resist 3 is modified from those of the first and second embodiments, and the other configurations are similar to those of the first and second embodiments. Hereinafter, only configurations different from the first and second embodiments will be described.

In the first and second embodiments, the pattern covering portions 3a, which cover the adjacent wiring patterns 1c, are not connected to each other in the area outside the resin mold part 4. In the present embodiment, on the other hand, the pattern covering portions 3a, which cover the adjacent straight portions 1ca and connected to each other via the connecting portion 3b, are connected to each other in an area outside of the resin mold part 4. Further, the distance from the end portion of the resin mold part 4 to the end portion of the connecting portion 3b is provided, so that the similar effects to the first and second embodiments can be achieved.

Figure 7:
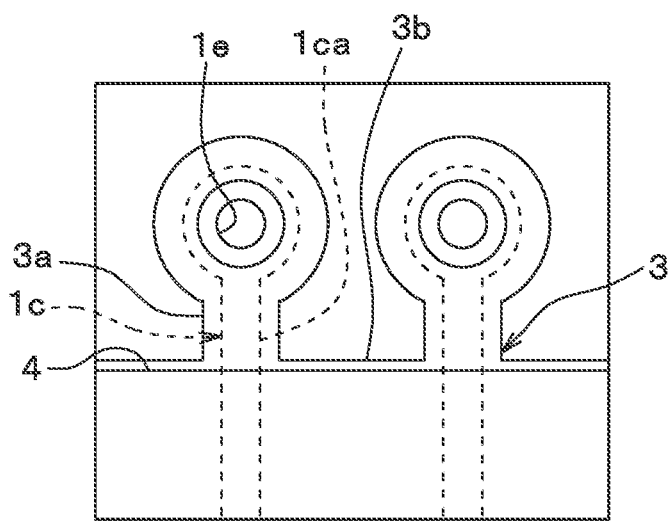
FIG. 7 is a diagram illustrating an enlarged upper surface layout of a part of an electronic device according to the third embodiment.

As shown in FIG. 7, in the present embodiment, the connecting portion 3b partly protrudes from the end portion of the resin mold part 4, so that a part of the connecting portion 3b is located in the area outside of the resin mold part 4.

In a case where the resin mold part 4 is formed by resin molding, such as a compression molding technique, it is preferable to form a mold tread portion to which the periphery of a cavity of a molding die used for molding, that is, the open end of the molding die is brought into contact. In particular, if the mold tread portion is formed entirely around the outer periphery of the cavity, the molding die can be brought into contact with the mold tread portion over the entire area around the cavity. In such a case, leakage of a resin during molding can be effectively suppressed.

In a case where the role of such a mold tread portion is provided by the solder resist 3, it is preferable that the solder resist 3 is formed so as to extend entirely around the outer periphery of the cavity. In this case, not only the pattern covering portions 3a but also the connecting portion 3b will protrude to the area outside the resin mold part 4.

Figure 8:
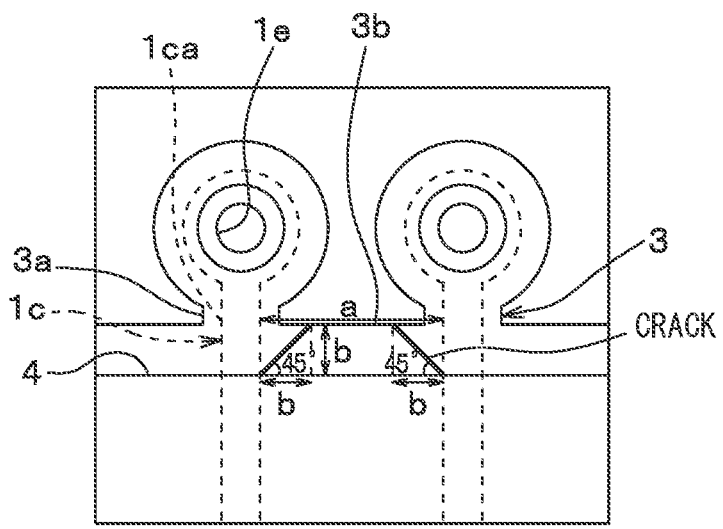
FIG. 8 is a diagram illustrating a relationship between an end of a resin molded part, an end of a connecting portion of a solder resist, and a crack.

Cracks generated in the solder resist 3 typically develop from opposite ends of the base portions of the wiring patterns 1c, as crack starting points, at an angle of 45° with respect to the end of the resin mold part 4, as shown in FIG. 8. The opposite ends of the base portions mean opposite sides of the wiring patterns 1c at the boundary positions between the wiring pattern 1c and the resin mold part 4 in the width direction of the wiring patterns 1c.

Since the cracks will develop in the above described manner, if the protruding amount of the connecting portion 3b from the resin mold part 4 is set only to that the cracks developed will not intersect with each other, a short-circuit between the adjacent wiring patterns 1c can be restricted, such as when the condensation is generated.

In this case, therefore, the pattern covering portions 3a and the connecting portion 3b are configured so as to satisfy a relationship as expressed by the following formula 1. In the formula 1, "a" represents the distance between the adjacent wiring patterns 1c, and "b" represents the protruding amount of the connecting portion 3b from the end portion of the resin mold part 4. In this case, the protruding amount of the connecting portion 3b from the end portion of the resin mold part 4 will also be referred to as a distance between the end portion of the resin mold part 4 and the end portion of the connecting portion 3b in the extended direction of the straight portion 1ca.

$$a > 2 \times b \quad \text{(Formula 1)}$$

As described above, if the distance "a" and the protruding amount "b" are set so that the relationship of "a>2×b" shown in the formula 1 is satisfied, the developed cracks can be restricted from intersecting with each other. Therefore, it is possible to suppress a short circuit between the adjacent wiring patterns 1c due to the condensation or the like.

Other Embodiments

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

For example, the pattern covering portion 3a may be formed along the straight portion 1ca. It is not always necessary that the pattern covering portion 3a is in straight shape. That is, it is not always necessary that the opposite sides of the pattern covering portion 3a are straight.

In the second and third embodiments, the end portion of the connecting portion 3b is straight. In the modification of the second embodiment, although the end portion of the connecting portion 3b is straight, the end portion of the connecting portion 3b is partly recessed. However, it is not always necessary that the end portion of the connecting portion 3b is straight. In a case where the adjacent pattern covering portions 3a are connected to each other through the connecting portion 3b, as in the third embodiment, the pattern covering portions 3a and the connecting portion 3b can be configured such that the distance "a" and the protruding amount "b" satisfy the relationship as defined by the above formula 1, at least at a position further from the area where the cracks develop in the connecting portion 3b.

Figure 9:
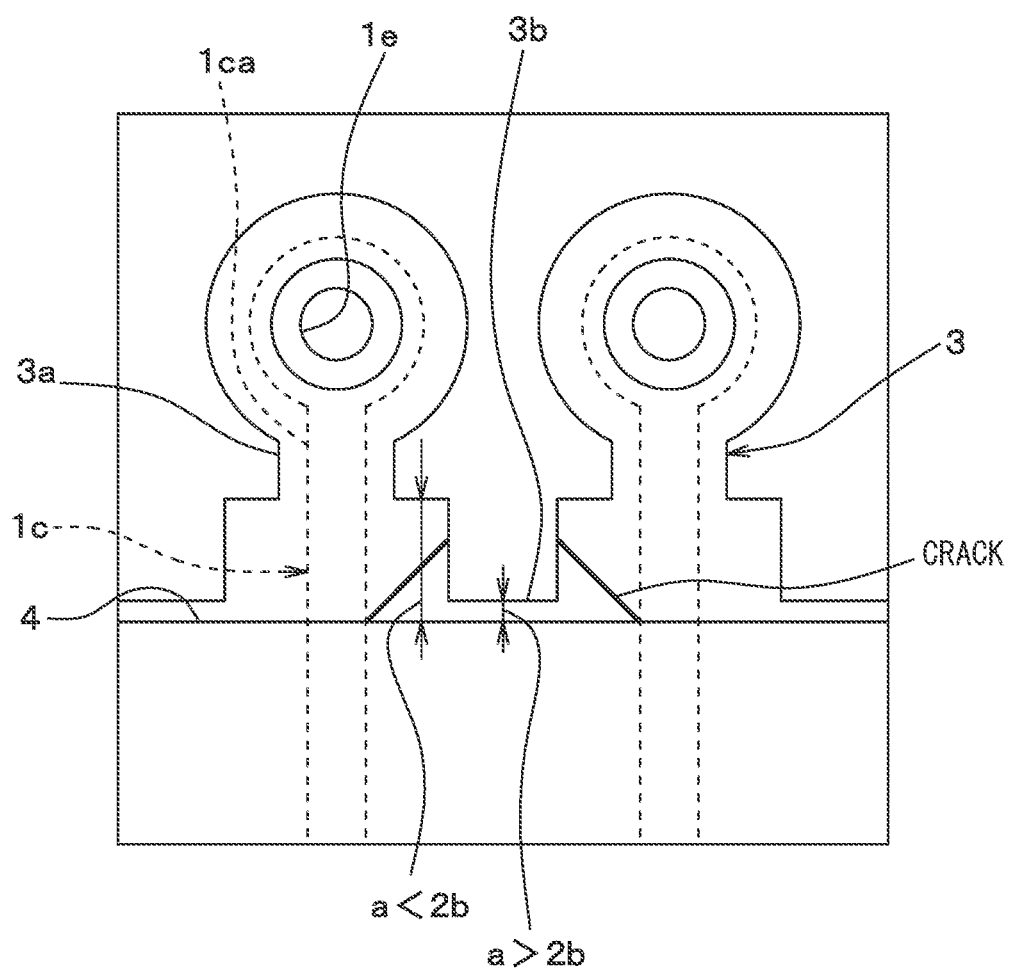
FIG. 9 is a diagram illustrating a relationship between an end of a resin molded part, an end of a connecting portion of a solder resist, and a crack according to another embodiment.

Specifically, in an arrangement direction in which the adjacent straight portions 1ca are arranged, the protruding amount "b" can be be greater than a half of the distance "a" at the position where a distance from the starting point of the crack is shorter than the protruding amount "b". For example, as shown in FIG. 9, in a portion of the connecting portion 3b located in the vicinity of the straight portion 1ca, the protruding amount "b" defined between the end portion of the resin mold part 4 and the end portion of the connecting portion 3b can be increased to be larger than that in the portion located at a central position between the adjacent straight portions 1ca. Also in that case, the relationship of "a<2b" is satisfied at the position where the distance from the crack starting point is less than a half of the distance "a", and the relationship of "a>2b" is satisfied at the position where the distance from the crack starting point is a half of the distance "a" or more. Also in such a structure, the cracks developed from the adjacent starting points will not intersect with each other. Therefore, the effects similar to the third embodiment can be achieved.

What is claimed is:

1. An electronic device comprising:
a substrate having one surface and another surface opposite to the one surface, and including a plurality of wiring patterns each having at least a straight portion;
a solder resist covering the wiring patterns;
an electronic component electrically connected to a portion of at least one of the wiring patterns on the one surface of the substrate, the portion being exposed from the solder resist; and
a resin mold part disposed on the one surface of the substrate to cover the electronic component and to partly cover the wiring patterns and the solder resist, wherein
the wiring patterns are disposed such that the straight portions are extended to an area outside of the resin mold part,
the solder resist includes pattern covering portions covering the straight portions of at least adjacent two of the wiring patterns, and
the pattern covering portions are separated from each other in the area outside of the resin mold part.

2. The electronic device according to claim 1, wherein
the solder resist includes a connecting portion that connects between the pattern covering portions, which cover the straight portions of the at least adjacent two of the wiring patterns, and
an entirety of an end portion of the connecting portion is located in an area covered with the resin mold part.

3. The electronic device according to claim 1, wherein
the solder resist includes a connecting portion that connects between the pattern covering portions, which cover the straight portions of the at least adjacent two of the wiring patterns, and
an end portion of the connecting portion is protruded to the area outside of the resin mold part while a part of the end portion of the connecting portion is located in an area covered with the resin mold part.

* * * * *